United States Patent
Tagashira

(10) Patent No.: US 11,013,135 B2
(45) Date of Patent: May 18, 2021

(54) CASING AND METHOD FOR MOUNTING SUBSTRATE TO CASING

(71) Applicant: KAWASAKI JUKOGYO KABUSHIKI KAISHA, Kobe (JP)

(72) Inventor: Tsuyoshi Tagashira, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 16/489,068

(22) PCT Filed: Feb. 26, 2018

(86) PCT No.: PCT/JP2018/007011
§ 371 (c)(1),
(2) Date: Aug. 27, 2019

(87) PCT Pub. No.: WO2018/155691
PCT Pub. Date: Aug. 30, 2018

(65) Prior Publication Data
US 2020/0008313 A1    Jan. 2, 2020

(30) Foreign Application Priority Data
Feb. 27, 2017    (JP) .............................. JP2017-034990

(51) Int. Cl.
*H05K 1/00*    (2006.01)
*H05K 1/18*    (2006.01)
*H05K 7/00*    (2006.01)
*H05K 7/14*    (2006.01)

(52) U.S. Cl.
CPC ................................. *H05K 7/1417* (2013.01)

(58) Field of Classification Search
CPC ............................. H05K 7/1417; H05K 7/14
See application file for complete search history.

(56) References Cited

U.S. PATENT DOCUMENTS

| | | | |
|---|---|---|---|
| 8,254,145 B2* | 8/2012 | Hsieh ...................... | G06F 1/185 361/807 |
| 8,295,060 B2* | 10/2012 | Liu .......................... | G06F 1/185 361/800 |
| 8,961,214 B2* | 2/2015 | Zhu ........................ | H01R 13/62 439/345 |
| 9,629,291 B1* | 4/2017 | Chen ...................... | H05K 13/04 |
| 10,324,886 B2* | 6/2019 | Muhsam ............... | H05K 7/1487 |

(Continued)

FOREIGN PATENT DOCUMENTS

| JP | H01-112093 U | 7/1989 |
|---|---|---|
| JP | 3068461 U | 5/2000 |

(Continued)

*Primary Examiner* — Yuriy Semenenko
(74) *Attorney, Agent, or Firm* — Oliff PLC

(57) ABSTRACT

A casing that can be compatible with plural types of substrates and a method for mounting a substrate to a casing are provided. The casing includes, in the inside of the casing, a substrate support portion and a substrate support body. The substrate support portion has a first support portion that can support a first substrate at a first substrate support position in the casing. The substrate support body has a second support portion that can support a second substrate at the first substrate support position.

8 Claims, 6 Drawing Sheets

(56) References Cited

U.S. PATENT DOCUMENTS

| | | | |
|---|---|---|---|
| 2002/0072255 A1* | 6/2002 | Leman | H01R 12/721 |
| | | | 439/61 |
| 2006/0216965 A1 | 9/2006 | Yamanashi et al. | |
| 2009/0055567 A1* | 2/2009 | Chen | H05K 7/1429 |
| | | | 710/302 |

FOREIGN PATENT DOCUMENTS

| | | |
|---|---|---|
| JP | 2002-353662 A | 12/2002 |
| JP | 2006-269632 A | 10/2006 |
| JP | 2012-222168 A | 11/2012 |

\* cited by examiner

[Fig. 1]
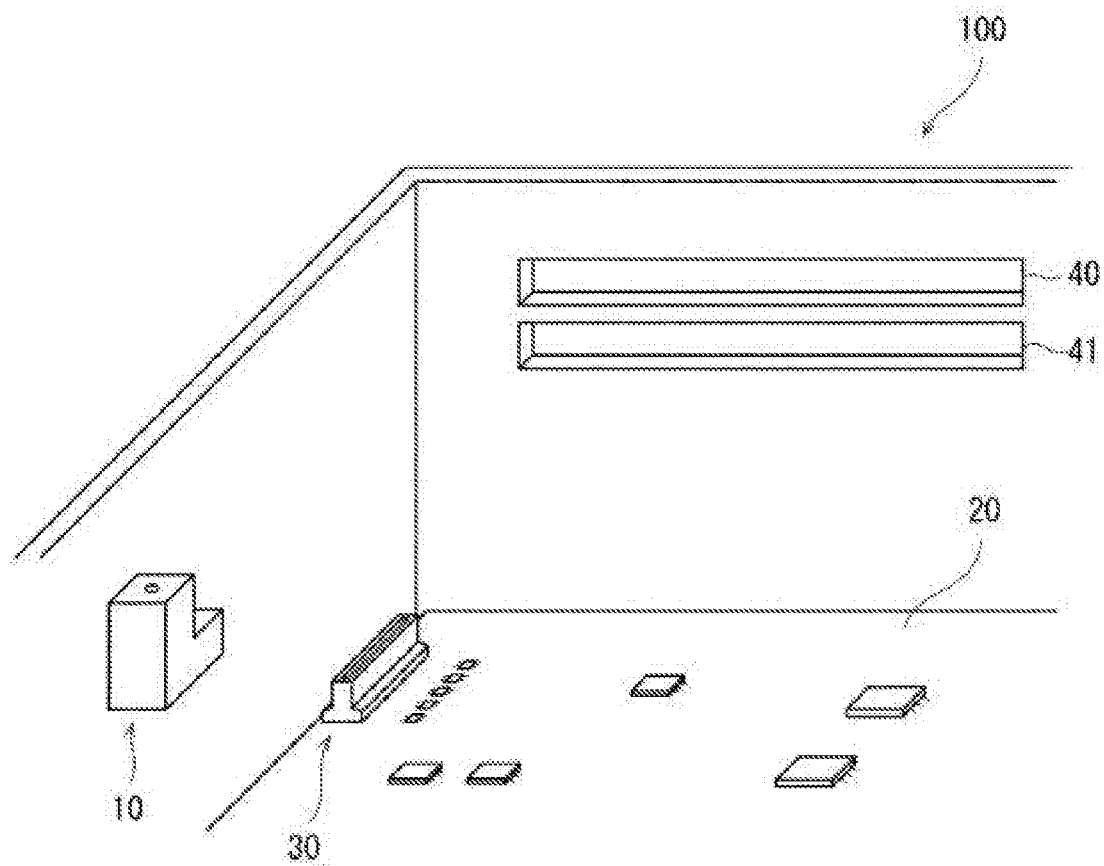
[Fig. 2]
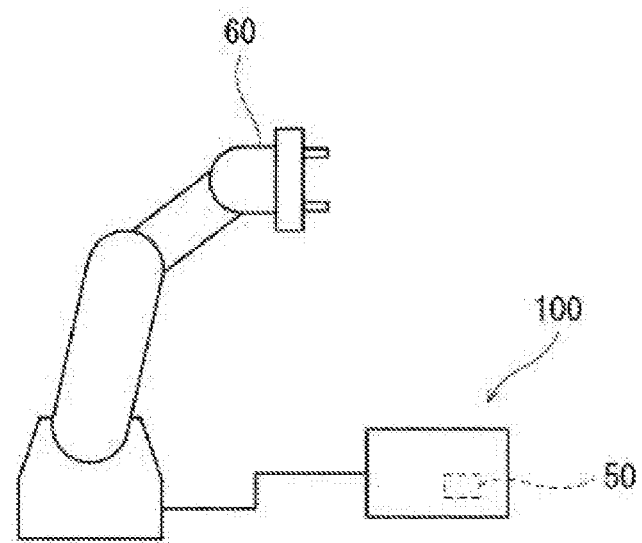

[Fig. 3]
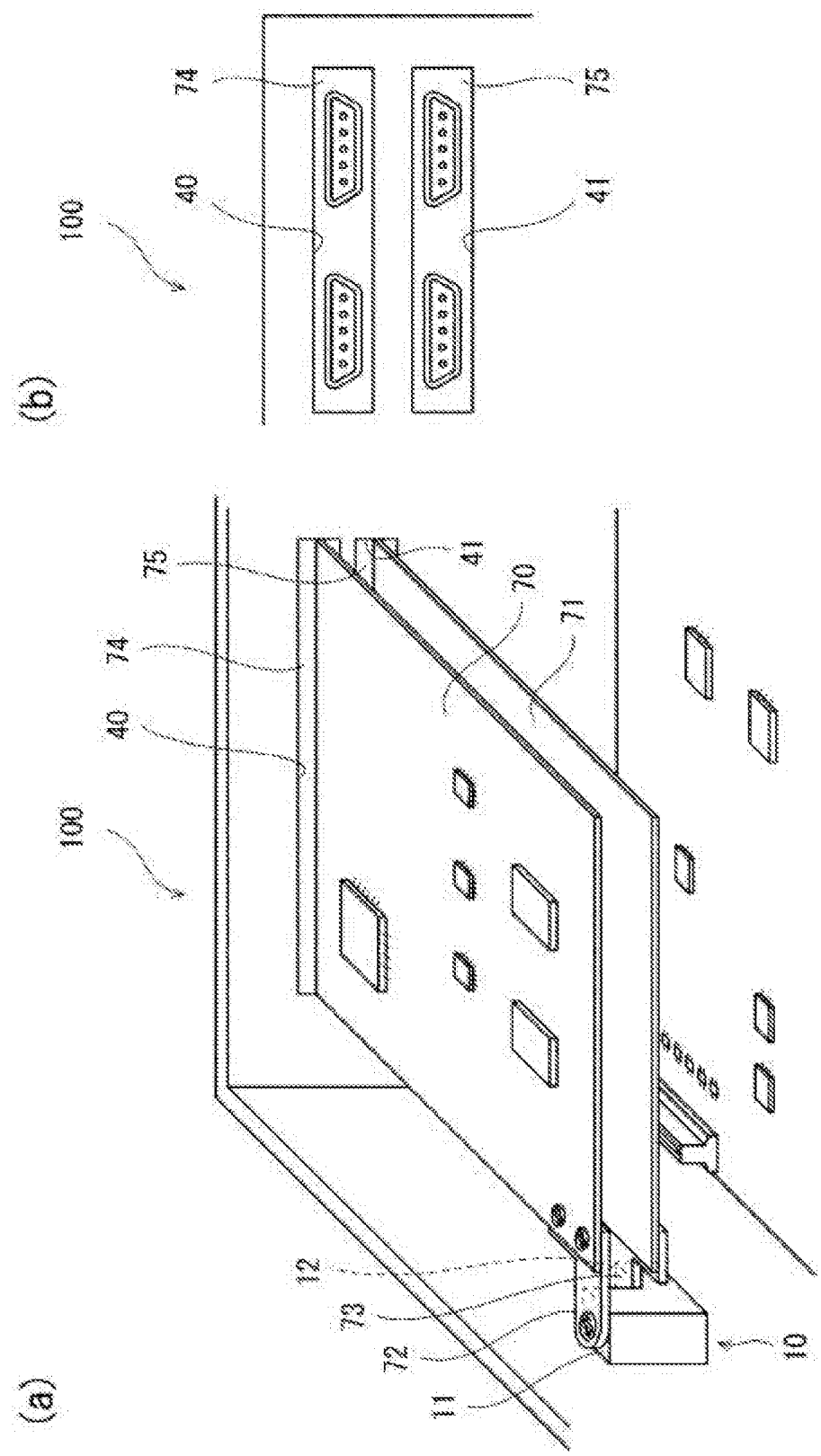

[Fig. 4]
(a)
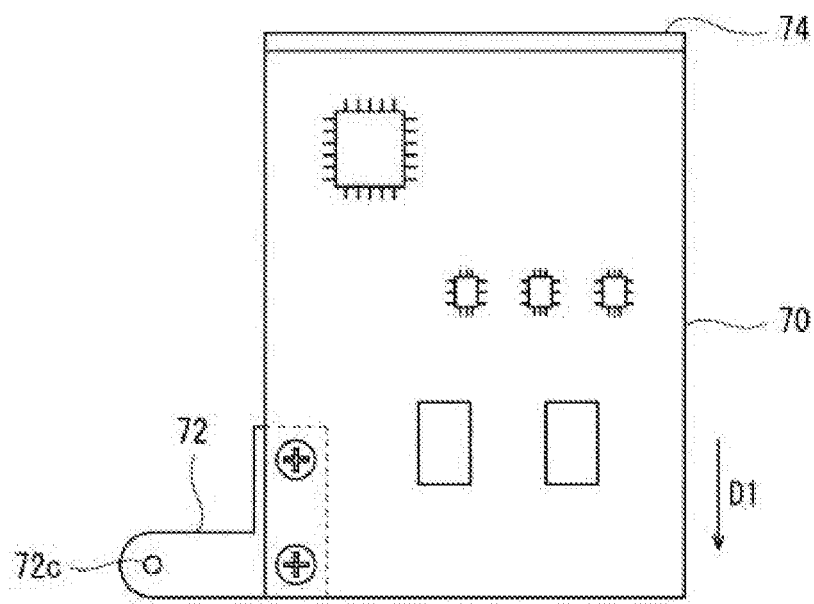
(b)
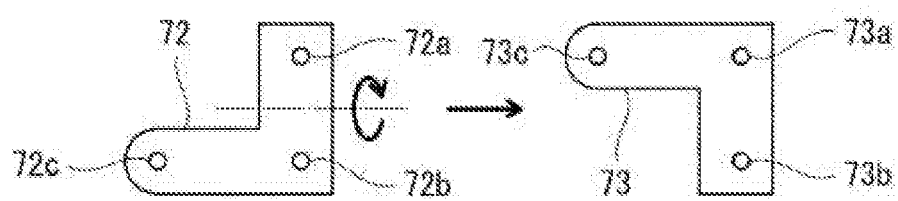
(c)
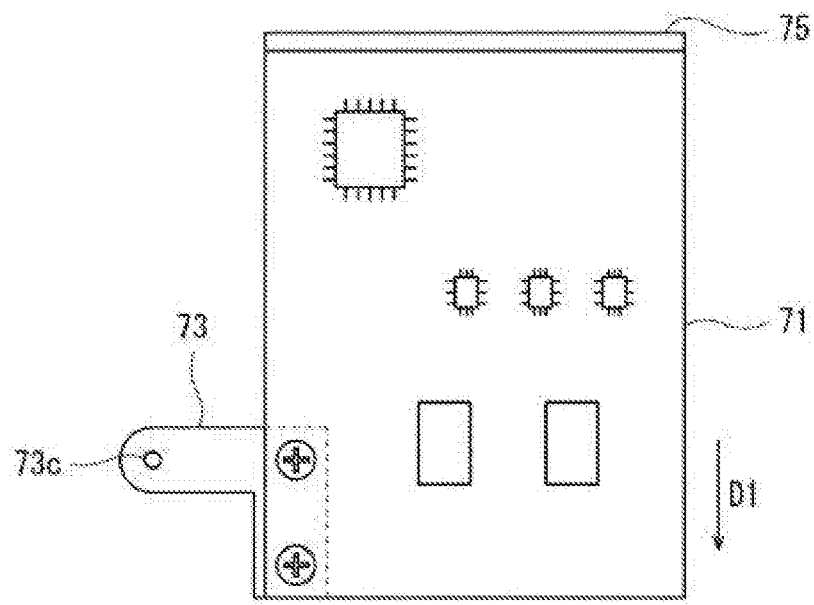

[Fig. 5]
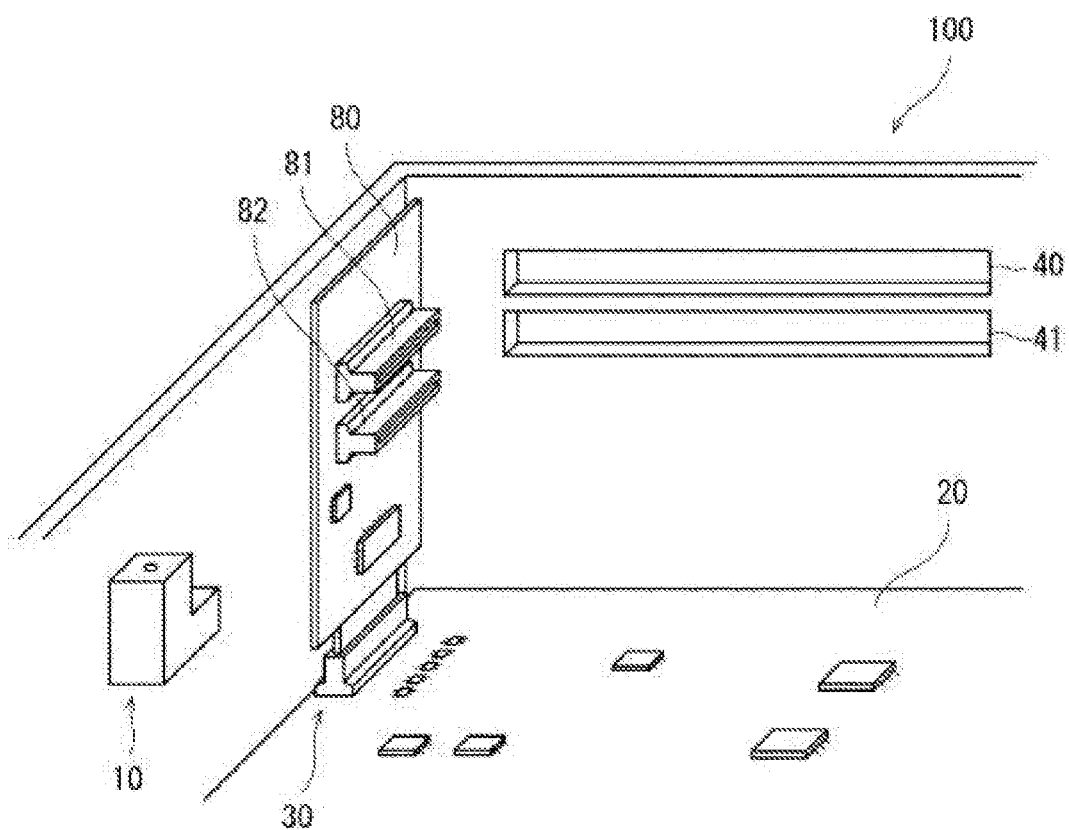

[Fig. 6]
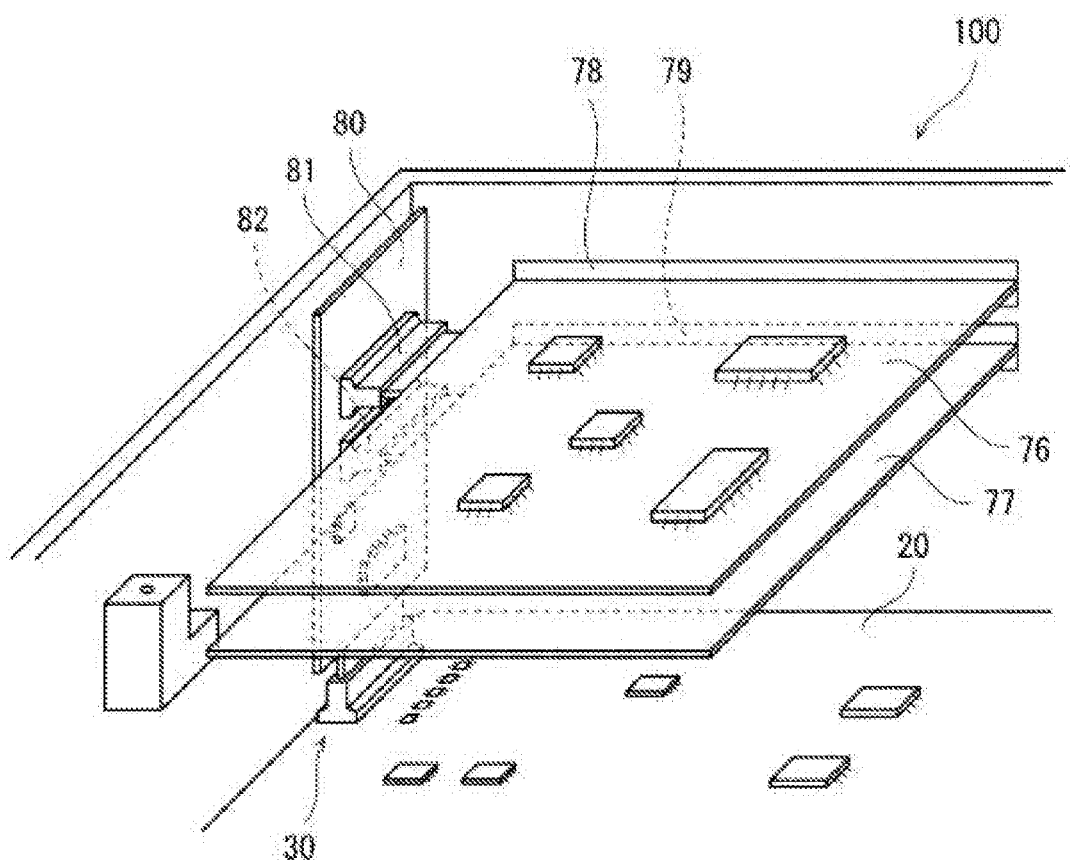

[Fig. 7]
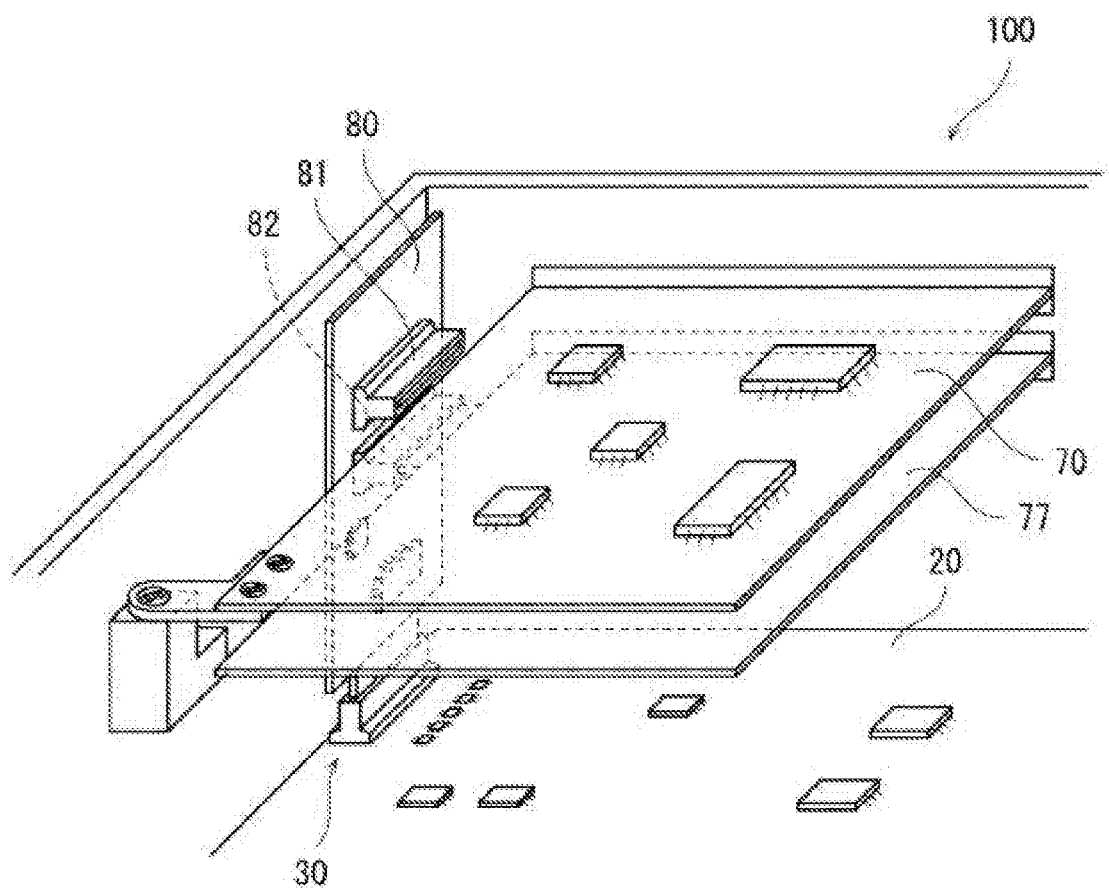

… (1) …

CASING AND METHOD FOR MOUNTING SUBSTRATE TO CASING

TECHNICAL FIELD

The present invention relates to a casing compatible with plural types of substrates and a method for mounting a substrate to a casing.

BACKGROUND ART

Conventionally, as a method for attaching a substrate to a casing, there is one that has the substrate mounted to a support base inside the casing. As a configuration of such a casing, for example, there is one disclosed in PTL 1. There is also one that supports a substrate by coupling a connector and a terminal. As a configuration of the above casing, for example, there is one disclosed in PTL 2.

CITATION LISTS

Patent Literatures

PTL 1: JP 2012-222168 A
PTL 2: JP 2006-269632 A

SUMMARY OF INVENTION

Technical Problem

PTLS 1 and 2 disclose a configuration for mounting a substrate to a mounting position corresponding to each substrate. However, the configuration for mounting each substrate is a configuration for mounting a substrate suitable only for the corresponding substrate. Therefore, when there is a request to change the substrate, the request cannot be dealt with immediately.

In particular, when a control substrate of an industrial robot is mounted to a casing and delivered to a customer, a request for the substrate often differs depending on the site. Therefore, a type of substrate required may be different for each site, and it is necessary to immediately deal with the request for the substrate that is different for each site. For example, at the time of delivery, although a casing mounted with a standard control substrate is delivered to a customer, there may be a case in which the standard control substrate does not meet a request of the customer and a control substrate customized according to the on-site request needs to be delivered. In the above case, the request for the different substrate needs to be dealt with immediately.

Accordingly, in view of the above-mentioned circumstances, an object of the present invention is to provide a casing compatible with plural types of substrates and a method for mounting a substrate to a casing.

Solution to Problem

A casing of the present invention includes a first substrate support portion and a second substrate support portion in an inside of the casing. The first substrate support portion has a first support portion that can support, at a first substrate support position in the casing, a first substrate having a supported portion at a predetermined location. The second substrate support portion has a second support portion that can support, at the first substrate support position, a second substrate having a supported portion at a predetermined location different from the predetermined position of the first substrate.

Advantageous Effects of Invention

According to the present invention, because the substrate can be supported in a compatible manner with the plural types of substrates, the request to change the substrate can be immediately dealt with. Therefore, usability of the casing for accommodating the substrate can be further improved.

BRIEF DESCRIPTION OF DRAWINGS

FIG. 1 is a perspective view showing a main portion of a casing according to an embodiment of the present invention.

FIG. 2 is a configuration view of a state in which the casing of FIG. 1 accommodates a control substrate that controls a robot.

FIG. 3($a$) is a perspective view of the main portion of the casing showing a state in which substrates are supported inside the casing of FIG. 1, and FIG. 3($b$) is a front view of the main portion of the casing when connectors attached to the substrates are viewed from the outside of the casing.

FIG. 4($a$) is a plan view of the substrate in a state of being supported inside the casing shown in FIG. 3($a$) and having the bracket attached, FIG. 4($b$) is an explanatory view for explaining a procedure at the time of reversing the front and back of the bracket, and FIG. 4($c$) is a plan view of the substrate in a state of having the reversed bracket attached.

FIG. 5 is a perspective view of the main portion of the casing showing a state in which a substrate support body is attached to a base substrate inside the casing of FIG. 1.

FIG. 6 is a perspective view of the main portion of the casing in a state where the substrates are gripped by substrate gripping portions in the substrate support body of FIG. 5.

FIG. 7 is a perspective view of the main portion of the casing showing a state in which the upper substrate is supported by the substrate support body and the lower substrate is gripped by the substrate gripping portion in the casing of FIG. 1.

DESCRIPTION OF EMBODIMENT

Hereinafter, a casing according to an embodiment of the present invention is described with reference to the attached drawings. FIG. 1 shows a perspective view of a main portion of a casing 100 of the present embodiment. In FIG. 1, in order to show an internal configuration of the casing 100, the casing 100 is shown with a lid removed.

The casing 100 is configured to allow a substrate to be arranged therein. In particular, the casing 100 is configured to allow plural types of substrates to be arranged therein. In the present embodiment, the casing 100 is configured to allow two types of substrates to be arranged therein.

The casing 100 is provided with a substrate support portion (first substrate support portion) 10. The substrate support portion 10 is configured to support a substrate having a supported portion at a predetermined location. In the present embodiment, corresponding to one type of substrate (first substrate) among the two types of substrates arranged in the casing 100, the substrate support portion 10 is configured to be able to support at a substrate support position for the one type of substrate.

The substrate support portion 10 is provided with plural support portions for supporting the substrate. In the present embodiment, the substrate support portion 10 is formed in a step shape. The substrate support portion 10 is provided with two support portions 11, 12 formed substantially horizontally. The substrate is supported by each of the support portions 11, 12.

Further, a base substrate (third substrate) 20 is attached to the casing 100. The base substrate 20 is provided with wiring and various elements. The base substrate 20 functions as a part of a control substrate. The base substrate 20 may not be a substrate. A block or the like may be used as a base. Also, the base may be other members.

Further, the base substrate 20 is provided with a substrate support body holding portion (second substrate support body holder) 30 for removably holding a substrate support body described later.

In the casing 100, opening portions 40, 41 are formed, each corresponding to the substrate support position as a substrate mounting space. In the present embodiment, the casing 100 is provided with two upper and lower substrate support positions in a vertical direction, and the two opening portions 40, 41 are formed corresponding to the respective substrate support positions.

In the present embodiment, the substrate arranged inside the casing 100 functions as a control substrate for controlling an operation of a robot 60. FIG. 2 shows a configuration view of when the casing 100 of the present embodiment is applied as the control substrate for controlling the robot 60.

As shown in FIG. 2, the casing 100 of the present embodiment has a control substrate 50 therein. The control substrate 50 is a substrate for controlling the operation of the robot 60. In other words, the casing 100 of the present embodiment accommodates therein the control substrate 50 for controlling the operation of the robot 60. Further, in the present embodiment, the robot 60 is used as a multi-axis industrial robot.

FIG. 3(a) shows a perspective view of a configuration inside the casing 100 when the one type of substrate (first substrate) among the two types of substrates that can be arranged is mounted in the casing 100 of the present embodiment.

As shown in FIG. 3(a), the casing 100 is configured to allow substrates 70, 71 to be mounted therein. In the present embodiment, the casing 100 is configured such that, for one type of substrate among the two types of substrates that are mountable, the two upper and lower substrates 70, 71 can be mounted in the vertical direction. That is, the casing 100 is configured such that the substrates 70, 71 can be mounted at the upper substrate support position and the lower substrate support position, respectively.

The substrate support portion 10 is configured to allow the two substrates 70, 71 to be supported in the vertical direction. The substrate support portion 10 is provided with two support portions 11, 12 formed substantially horizontally. As described above, the substrate support portion 10 includes the support portion (first support portion) 11 that can support the substrate at the upper substrate support position (first substrate support position) in the casing 100, and the support portion (third support portion) 12 that can support the substrate at the lower substrate support position (second substrate support position) in the casing 100). Further, the substrate support portion 10 is formed in a step shape so as to have the two support portions 11, 12. The substrate support portion 10 can support the substrate with each of the support portion 11 and the support portion 12.

In the present embodiment, the upper substrate support position and the lower substrate support position are arranged vertically. Each of the upper substrate support position and the lower substrate support position is provided in the casing 100 so as to be parallel to each other. Brackets 72, 73 are attached to the substrates 70, 71, respectively.

The brackets 72, 73 are described. The brackets 72, 73 are attached to the substrates 70, 71, respectively, for being attached to the substrate support portion 10. FIG. 4(a) shows the plan view of the substrate 70 to which the bracket 72 is attached.

The bracket 72 is provided with holes 72a, 72b for attaching the bracket 72 to the substrate 70. The bracket 72 is attached to the substrate 70 by being screwed through the holes 72a, 72b. In the present embodiment, the two holes 72a, 72b for attaching the bracket 72 to the substrate 70 are formed, and the bracket 72 is attached to the substrate 70 by screwing at the two locations.

Further, the bracket 72 is provided with a hole 72c at a position different from the holes for attaching the bracket 72 to the substrate 70. The bracket 72 is attached to the substrate support portion 10 provided on a side of the casing 100 by being screwed through the hole 72c. The substrate 70 is fixedly attached to the inside of the casing 100 by the bracket 72 being screwed and fixedly attached to the substrate support portion 10.

In the bracket 72, the hole 72c for being screwed to the substrate support portion 10 are formed on an outside with respect to a longitudinal direction D1 of the substrate 70. With this configuration, the bracket 72 is attached to the support portion 11 of the substrate support portion 10, and is configured as the bracket 72 corresponding to the upper substrate 70 in the substrate support portion 10. Accordingly, when the hole 72c is arranged on the outside in the longitudinal direction D1 of the substrate 70, the bracket 72 corresponds to the upper substrate 70 among the two substrates 70, 71 shown one above the other in the vertical direction as shown in FIG. 3.

As shown in FIG. 4(b), the front and back of the bracket is reversed about a center portion of the bracket with respect to the longitudinal direction D1 of the substrate 70. At this time, the bracket functions as the bracket 73 corresponding to the lower substrate 71 among the two substrates 70 and 71 shown one above the other in the vertical direction as shown in FIG. 3. FIG. 4(b) shows a configuration view explaining a reversing procedure, in which the front and back of the bracket is reversed and among the two upper and lower substrates 70, 71 in the vertical direction, the bracket 72 corresponding to the upper substrate 70 is switched to the bracket 73 corresponding to the lower substrate 71.

When the bracket 72 is reversed, the hole 72c of the bracket 72 screwed to the substrate support portion 10 moves inward with respect to the longitudinal direction D1 of the substrate 70, and becomes a hole 73c corresponding to the lower substrate 71 and for being attached to the support portion 12.

FIG. 4(c) shows a plan view of the substrate 71 when the reversed bracket 73 is attached to the substrate 71 as the bracket 73 corresponding to the lower substrate support position. As shown in FIG. 4(c), because the hole 73c is attached to the substrate 71 in a state of being moved inward in the longitudinal direction D1 of the substrate 70, the bracket 73 is attached to the substrate support portion 10 at the support portion 12 corresponding to the lower substrate 71. Therefore, the bracket 73 is attached to the substrate 71 by being screwed as the bracket 73 corresponding to the lower substrate 71, and also, the bracket 73 is attached to the support portion 12 of the substrate support portion 10 by screwing. Accordingly, the bracket 73 is fixedly attached to the substrate 71 and is also fixedly attached to the substrate support portion 10. As a result, the substrate 71 is fixedly attached to the substrate support portion 10 and is fixedly attached to the casing 100.

As described above, by reversing the front and back of the brackets 72, 73, the bracket 72 corresponding to the upper substrate 70 can be switched to the bracket 73 corresponding to the lower substrate 71. Therefore, when the type of substrate does not differ between the upper substrate 70 and the lower substrate 71, the substrate 70 arranged at an upper portion and the substrate 71 arranged at a lower portion can be switched between one another without changing the substrate itself. Accordingly, in order to arrange the substrate at each mounting position, the substrate does not need to be formed into a shape suitable for each mounting position.

With this configuration, the substrate can be commonly used between the upper substrate 70 and the lower substrate 71. Because the substrates are commonly used between the upper substrate 70 and the lower substrate 71, a manufacturing cost of the substrates can be suppressed low. Therefore, the manufacturing cost of the casing 100 in which the control substrate 50 is accommodated can be suppressed low.

Further, because the substrates can be commonly used between the upper substrate 70 and the lower substrate 71, standard substrates can be used as the common substrates. Therefore, the manufacturing cost of the casing 100 in which the control substrate 50 is accommodated can be suppressed lower.

A connector 74 is provided on a surface of the substrate 70 facing the opening portion 40 of the casing 100. FIG. 3(b) shows the front view of the connectors 74, 75 viewing from the outside of the casing 100. The substrate 70 is supported by the casing 100 by having the connector 74 attached to the opening portion 40 in a state in which the connector 74 is attached to the substrate 70. Accordingly, the substrate 70 is firmly supported inside the casing 100.

Similarly, the connector 75 is provided on a surface of the substrate 71 facing the opening portion 41 of the casing 100. The substrate 71 is supported by the casing 100 by having the connector 75 attached to the opening portion 41 in a state in which the connector 75 is attached to the substrate 71. Accordingly, the substrate 71 is firmly supported inside the casing 100.

Next, a configuration is described in which a substrate (second substrate) of a type different from the substrate (first substrate) supported by the substrate support portion 10 is supported in the casing 100. The different type of substrate (second substrate) has a supported portion at a predetermined location different from the substrate (first substrate) supported by the substrate support portion 10. At the time of attaching the different type of substrate (second substrate), a substrate support body (second substrate support portion) 80 is attached to the substrate support body holding portion 30.

FIG. 5 shows a perspective view of the main portion inside the casing 100 when the substrate support body 80 is attached to the substrate support body holding portion 30. The substrate support body 80 is detachably held on the base substrate 20. In the present embodiment, the substrate support body 80 is provided with wiring, elements, and the like, and functions as a substrate. The substrate support body 80 is arranged such that a main surface of the substrate support body 80 is orthogonal to a plane including a main surface of the base substrate 20. Therefore, the substrate support body 80 is arranged such that the main surface of the substrate support body 80 is orthogonal to a plane including main surfaces of the substrates (first substrate, second substrate) mounted inside the casing 100.

The substrate support body 80 is provided with substrate gripping portions (substrate grippers) 81, 82 that can support the substrate (second substrate). The substrate support body 80 has a substrate gripping portion (second support portion) 81 that can support the substrate at the upper substrate support position (first substrate support position), and a substrate gripping portion (fourth support portion) 82 that can support the substrate at the lower substrate support position (second substrate support position). The substrate gripping portions 81, 82 grip the different type of substrate (second substrate) at a position common to the position where the substrate (first substrate) supported by the substrate support portion 10 is mounted. In other words, the different type of substrate (second substrate) is mounted at a position overlapping with the position where the substrate (first substrate) supported by the substrate support portion 10 is mounted. Accordingly, the substrate support body 80 can support the substrate at the upper substrate support position and the lower substrate support position. Therefore, a configuration is made that allows both the substrate supported by the substrate support portion 10 and the substrate gripped by the substrate support body 80 to be mounted at the common substrate support position. The substrate support position of the substrate (first substrate) supported by the substrate support portion 10 and the substrate support position of the substrate (second substrate) supported by the substrate support body 80 can be made common.

Here, the position at which the different type of substrate (second substrate) is mounted may be a position that partially overlaps the position at which the substrate supported by the substrate support portion 10 is mounted. The position of the substrate (first substrate) supported by the substrate support portion 10 may not completely coincide with the position of the different type of substrate (second substrate). A part of the support position of the substrate (first substrate) supported by the substrate support portion 10 and a part of the support position of the different type of substrate (second substrate) should partially overlap with each other. Only at least a part of a mounting space in which the substrate is mounted may be shared between the substrate (first substrate) supported by the substrate support portion 10 and the different type of substrate (second substrate).

The substrate gripping portions 81, 82 function as connectors. When the substrates are gripped by the substrate gripping portions 81, 82, the substrates gripped by the substrate gripping portions 81, 82 are electrically connected to the substrate gripping portions 81, 82, respectively. By connecting the substrates to the substrate gripping portions 81, 82 as connectors, the substrate gripping portions 81, 82 grip the substrates.

FIG. 6 shows a perspective view of the main portion of the casing 100 in a state in which substrates 76, 77 are gripped by the substrate gripping portions 81, 82. As shown in FIG. 6, the substrates 76, 77 are connected to the substrate gripping portions 81, 82 as connectors, respectively. With this configuration, the substrates 76, 77 are gripped by the substrate gripping portions 81, 82.

In the present embodiment, the substrate gripping portions 81, 82 grip the two substrates 76, 77 arranged one above the other in the vertical direction. The substrate gripping portion 81 grips the substrate 76 at an upper portion, and the substrate gripping portion 82 grips the substrate 77 at a lower portion.

Here, the base substrate 20 is firmly attached to the casing 100. The substrate support body holding portion 30 is fixedly attached to the base substrate 20. The substrate support body 80 is firmly attached to the substrate support body holding portion 30 by being fastened with a connector. The substrate gripping portions 81, 82 are fixedly attached to the substrate support body 80. The substrates 76, 77 are firmly attached to the substrate gripping portions 81, 82 by being fastened with connectors. As a result, the substrates 76, 77 are firmly attached to the casing 100.

Connectors 78, 79 are attached to surfaces of the substrates 76, 77 facing the opening portions 40, 41 of the casing 100.

The substrate 76 is supported by the casing 100 by attaching the connector 78 to the opening portion 40 in a state in which the connector 78 is attached to the substrate 76. Accordingly, the substrate 76 is firmly supported inside the casing 100. Similarly, the substrate 77 is supported by the casing 100 by attaching the connector 79 to the opening portion 41 in a state in which the connector 79 is attached to the substrate 77. Accordingly, the substrate 77 is firmly supported inside the casing 100.

In the present embodiment, the substrate support body 80 is a substrate (fourth substrate) connected to the substrates 76, 77 and the base substrate 20. When the substrates 76, 77 are supported by the substrate support body 80, the substrates 76, 77 and the base substrate 20 are electrically connected with each other via the substrate support body 80. The substrate support body 80 may be a substrate on which circuits required for the substrates 76, 77 to be applied inside the casing 100 are formed.

As described above, according to the casing 100 of the present embodiment, the different type of substrate can be mounted at a position overlapping with the mounting position of the substrate supported by the substrate support portion 10. Therefore, the type of substrate mounted inside the casing 100 can be easily changed. Because the type of substrate can be easily changed, when there is a request for changing the substrate, the request can be immediately dealt with. Therefore, the usability of the casing 100 can be improved.

Further, according to the method for mounting the substrate of the present embodiment, when the substrate supported by the substrate support portion 10 is mounted on the casing 100, the substrate is supported by the substrate support portion 10. When the substrate gripped by the substrate gripping portions 81, 82 is mounted in the casing 100, the substrate is supported by the substrate support body 80 held by the substrate support body holding portion 30. As described above, the substrate can be selectively mounted inside the casing 100 according to a request.

In particular, when a casing accommodating a control substrate of a robot is delivered to a customer, the types of substrates used often differ depending on the site. As described above, the control substrate that controls the robot is often changed according to the environment around the robot. Therefore, the control substrate inside the casing is often changed. In addition, at the time of delivery, although a casing mounted with a standard control substrate is delivered to a customer, there may be a case in which the standard control substrate does not meet a request of the customer and a control substrate customized according to the on-site request needs to be delivered.

In the casing 100 of the present embodiment, because the control substrate can be easily changed, when there is a request for changing the control substrate at the site, replacement of the substrate can be smoothly performed. Accordingly, because a specification of the casing 100 does not need to be changed for every site, the manufacturing cost of the casing 100 and the control substrate can be suppressed low. In addition, because the substrate can be replaced smoothly, customer waiting time can be reduced. With this configuration, inconvenience felt by the customer can be suppressed.

Note that although the above embodiment described the mode in which the substrate support body 80 is a substrate, the present invention is not limited to this. The substrate support body 80 may be a plate-like member that is not a substrate. The substrate support body 80 may not have a plate-like shape, and may have other shapes. The substrate support body 80 may not be a substrate as long as the gripper for holding the two substrates mounted inside the casing 100 can be arranged at positions corresponding to the positions of the two substrates.

Moreover, although the above embodiment described the mode in which the substrate gripping portions 81, 82 are connectors, the present invention is not limited to this. The substrate gripping portions provided on the substrate support body 80 may be, for example, clamp portions that hold the substrates by clamps. Moreover, the substrate gripping portions may have other configurations as long as the substrates can be gripped.

Moreover, although the above embodiment described the mode in which the substrates of the same type are mounted in the upper substrate mounting position and the lower substrate mounting position, the present invention is not limited to the above embodiment. For the substrate mounted at the upper mounting position and the substrate mounted at the lower mounting position, different types of substrates may be used.

FIG. 7 shows an internal configuration of the casing 100 in which different types of substrates are used for the substrate mounted at the upper substrate mounting position and the substrate mounted at the lower substrate mounting position. In FIG. 7, the substrate (first substrate) supported by the substrate support portion 10 is mounted at the upper substrate mounting position, and the substrate (second substrate) gripped by the substrate support body 80 is mounted at the lower substrate mounting position. In this manner, different types of substrates may be mounted at two substrate mounting positions in the one casing 100.

Note that in FIG. 7, the substrate (first substrate) supported by the substrate support portion 10 is mounted at the upper substrate mounting position, and the substrate (second substrate) gripped by the substrate support body 80 is mounted at the lower substrate mounting position. However, the present invention is not limited to this. A relationship between the substrate mounted at the upper substrate mounting position and the substrate mounted at the lower substrate mounting position may be reversed. In other words, the substrate (second substrate) gripped by the substrate support body 80 may be mounted at the upper substrate mounting position, and the substrate (first substrate) supported by the substrate support portion 10 may be mounted at the lower substrate mounting position.

In the above embodiment, the substrate support body holding portion 30 is formed on the base substrate 20 and the substrate support body 80 is connected to and held by the substrate support body holding portion 30, but the present invention is not limited to this. The substrate support body 80 may be fixed to the base substrate 20 or may be fixed directly to the casing 100. The substrate support body 80 may be provided in a fixed or removable manner with respect to the base substrate 20 or the casing 100.

Moreover, although the present embodiment described the mode in which the two upper and lower substrate support positions for supporting the substrates are provided inside the casing 100, the present invention is not limited to this.

The casing may have a configuration in which different types of substrates can be mounted at three or more plural common positions. In addition, the casing may have a configuration in which different types of substrates can be mounted at one common position.

Moreover, although the present embodiment described the mode in which the substrates are respectively mounted at the positions of two different heights, the present invention is not limited to this. The casing may have a configuration in which the substrates are mounted at plural positions at the same height. The casing may be configured such that plural substrates are mounted at plural positions of the same height as long as different types of substrates can be mounted in the shared space.

Moreover, in the present embodiment, the substrate support body 80 is arranged such that the main surface of the substrate support body 80 is orthogonal to the plane including the main surfaces of the substrates (first substrate, second substrate) mounted inside the casing 100. However, the present invention is not limited to this. The substrate support body 80 may be arranged such that the main surface of the substrate support body 80 obliquely intersects the plane including the main surfaces of the substrates mounted in the casing 100. The substrate support body 80 may be arranged such that the main surface of the substrate support body 80 intersects the plane including the main surfaces of the substrates. As long as the different type of substrate (second substrate) is supported at the support position common with the substrate (first substrate) supported by the substrate support portion 10, the main surface of the substrate support body 80 and the main surfaces of the substrates do not need to be in the orthogonal positional relationship with each other.

REFERENCE SIGNS LIST

10 substrate support portion
20 base substrate
30 substrate support body holding portion

The invention claimed is:

1. A casing comprising a first substrate support portion and a second substrate support portion in an inside of the casing,
wherein:
the first substrate support portion has a first support portion that can support, at a first substrate support position in the casing, a first substrate having a supported portion at a predetermined location,
the second substrate support portion has a second support portion that can support, at the first substrate support position, a second substrate having a supported portion at a predetermined location different from the predetermined location of the first substrate,
the first substrate support portion has a third support portion that can support the first substrate at a second substrate support position,
the second substrate support portion has a fourth support portion that can support the second substrate at the second substrate support position, and
the first substrate is attached to the first substrate support portion with a bracket that can switch a position to be supported, between the first substrate support position and the second substrate support position by reversing the bracket.

2. The casing according to claim 1, wherein the first substrate support position and the second substrate support position are aligned.

3. The casing according to claim 1, wherein the second substrate support portion is detachably attached.

4. The casing according to claim 3, further comprising a third substrate,
wherein the second substrate support portion is detachably attached to the third substrate.

5. The casing according to claim 1, wherein the second substrate support portion is a fourth substrate.

6. The casing according to claim 5, wherein the fourth substrate is arranged such that a main surface of the fourth substrate intersects a plane including main surfaces of the first substrate and the second substrate.

7. The casing according to claim 1, wherein a type of substrate is different between the substrate supported at the first substrate support position and the substrate supported at the second substrate support position.

8. A method for mounting a substrate to a casing, the casing including:
a first substrate support portion having a first support portion that can support a first substrate at a first substrate support position, and a third support portion that can support the first substrate at a second substrate support position, and
a second substrate support portion having a second support portion that can support a second substrate different from the first substrate at the first substrate support position, and a fourth support portion that can support the second substrate at the second substrate support position,
the method including:
mounting the first substrate in the casing such that the first substrate is supported by the first substrate support portion at the first substrate support position or the second substrate support position, and
mounting the second substrate in the casing such that the second substrate is supported by the second substrate support portion,
wherein the first substrate is supported at the first substrate support position or the second substrate support position with a bracket that can be reversed to switch a support position of the first substrate between the first substrate support position and the second substrate support position.

* * * * *